United States Patent
Kurihara et al.

(10) Patent No.: US 12,414,384 B2
(45) Date of Patent: Sep. 9, 2025

(54) SOLAR CELL SEALING MATERIAL AND SOLAR CELL MODULE

(71) Applicant: MITSUI CHEMICALS ICT MATERIA, INC., Tokyo (JP)

(72) Inventors: Rie Kurihara, Ibaraki (JP); Yasuo Oeda, Hitachinaka (JP); Jun Tokuhiro, Tokyo (JP)

(73) Assignee: MITSUI CHEMICALS ICT MATERIA, INC., Tokyo (JP)

( * ) Notice: Subject to any disclaimer, the term of this patent is extended or adjusted under 35 U.S.C. 154(b) by 0 days.

(21) Appl. No.: 17/964,187

(22) Filed: Oct. 12, 2022

(65) Prior Publication Data

US 2023/0040092 A1 Feb. 9, 2023

Related U.S. Application Data

(62) Division of application No. 16/761,526, filed as application No. PCT/JP2018/042832 on Nov. 20, 2018, now abandoned.

(30) Foreign Application Priority Data

Nov. 20, 2017 (JP) .................................. 2017-222823

(51) Int. Cl.
*H10F 19/80* (2025.01)
*C08K 5/14* (2006.01)
(Continued)

(52) U.S. Cl.
CPC .............. *H10F 19/804* (2025.01); *C08K 5/14* (2013.01); *C08L 23/08* (2013.01); *C08L 23/16* (2013.01)

(58) Field of Classification Search
CPC ....... H01L 31/0481; C08K 5/14; C09L 23/08; C09L 23/16; H10F 19/804
(Continued)

(56) References Cited

U.S. PATENT DOCUMENTS

| 8,350,147 B2 | 1/2013 | Nishijima et al. |
| 9,595,630 B2 | 3/2017 | Ikenaga et al. |

(Continued)

FOREIGN PATENT DOCUMENTS

| JP | 2011228435 A | 11/2011 |
| JP | 2012-009663 A | 1/2012 |

(Continued)

OTHER PUBLICATIONS

International Search Report (PCT/ISA/210) issued on Jan. 29, 2019, by the Japanese Patent Office as the International Searching Authority for International Application No. PCT/JP2018/042832.
(Continued)

*Primary Examiner* — Kourtney R S Carlson
(74) *Attorney, Agent, or Firm* — BUCHANAN INGERSOLL & ROONEY PC

(57) ABSTRACT

A solar cell sealing material of the present invention is a solar cell sealing material that is used to seal a solar cell element and includes an ethylene·α-olefin copolymer, an organic peroxide (A) having a one-hour half-life temperature in a range of equal to or higher than 100° C. and equal to or lower than 130° C., and an organic peroxide (B) having a one-hour half-life temperature in a range of higher than 130° C. and equal to or lower than 160° C., and a ratio $(X_2/X_1)$ of a content $X_2$ of the organic peroxide (B) to a content $X_1$ of the organic peroxide (A) in the solar cell sealing material is equal to or more than 0.05 and equal to or less than 1.10.

10 Claims, 1 Drawing Sheet

(51) Int. Cl.
*C08L 23/08* (2025.01)
*C08L 23/16* (2006.01)

(58) Field of Classification Search
USPC .................................................. 136/242–265
See application file for complete search history.

(56) References Cited

U.S. PATENT DOCUMENTS

| | | | |
|---|---|---|---|
| 2009/0023867 | A1 | 1/2009 | Nishijima et al. |
| 2010/0069538 | A1 | 3/2010 | Kempe |
| 2014/0202536 | A1 | 7/2014 | Ikenaga et al. |
| 2015/0007883 | A1* | 1/2015 | Ikenaga .................. C08K 5/00 524/102 |
| 2017/0183431 | A1 | 6/2017 | Yoda |
| 2017/0204249 | A1 | 7/2017 | Murofushi et al. |

FOREIGN PATENT DOCUMENTS

| | | | | |
|---|---|---|---|---|
| JP | 2014187316 | A | 10/2014 | |
| JP | 2014-216400 | A | 11/2014 | |
| WO | 2006085603 | A1 | 8/2006 | |
| WO | WO-2008036707 | A2 * | 3/2008 | ....... B32B 17/10018 |
| WO | 2013024599 | A1 | 2/2013 | |
| WO | 2015199029 | A1 | 12/2015 | |

OTHER PUBLICATIONS

Written Opinion (PCT/ISA/237) issued on Jan. 29, 2019, by the Japanese Patent Office as the International Searching Authority for International Application No. PCT/JP2018/042832.

\* cited by examiner

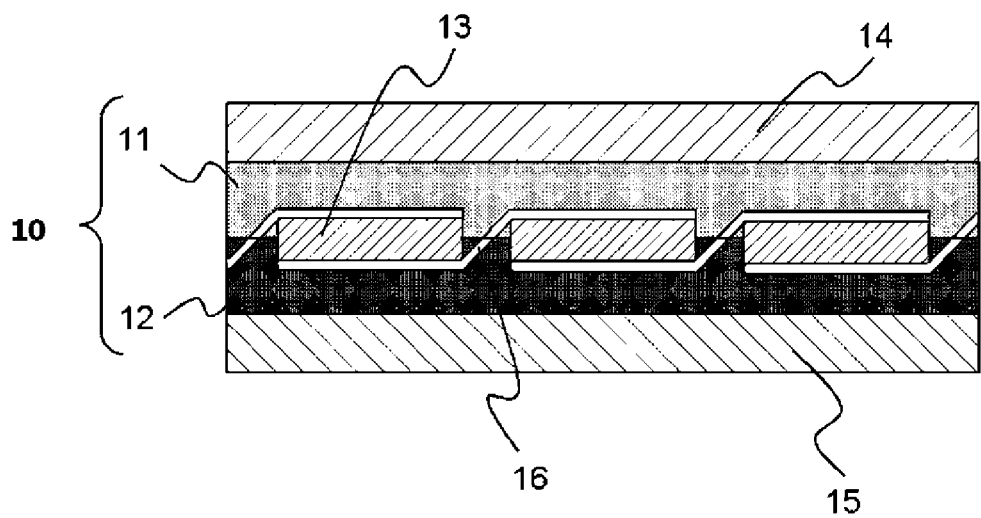

SOLAR CELL SEALING MATERIAL AND SOLAR CELL MODULE

CROSS REFERENCE OF RELATED APPLICATIONS

This application is a division of U.S. patent application Ser. No. 16/761,526, filed on May 5, 2020, now abandoned, entitled "SOLAR CELL SEALING MATERIAL AND SOLAR CELL MODULE," which in turn is a national stage application of PCT/JP2018/042832, filed on Nov. 20, 2018, which in turn claims priority to Japanese Patent Application No. 2017-222823, filed on Nov. 20, 2017. The entire content of each of the prior applications is hereby incorporated by reference.

TECHNICAL FIELD

The present invention relates to a solar cell sealing material and a solar cell module.

BACKGROUND ART

In recent years, solar power generation has been spotlighted as green energy, and development of solar cell modules for solar power generation has been underway. Generally, a solar cell module is made up of protective glass (front surface-side transparent protective member), a light-receiving surface-side solar cell sealing material, a solar cell element, a rear surface-side solar cell sealing material, and a backsheet (rear surface-side protective member). In the manufacturing of the solar cell module, the solar cell sealing materials are heated in a state in which the respective layers described above are laminated together, whereby a resin in the solar cell sealing materials melts and seals the solar cell element and, furthermore, adheres to the protective glass or the backsheet.

As the solar cell sealing material, a solar cell sealing material for which a low-melt flow rate (MFR) type ethylene·α-olefin copolymer is used is known (for example, refer to Patent Document 1).

Patent Document 1 describes a solar cell sealing material including a low-MFR type ethylene·α-olefin copolymer and, as a crosslinking agent, peroxyketal having a specific structure.

In addition, Patent Document 1 describes that the solar cell sealing material in which a low-MFR type ethylene·α-olefin copolymer is used has an excellent calendar formability.

RELATED DOCUMENT

Patent Document

[Patent Document 1] Pamphlet of International Publication No. WO2013/024599

SUMMARY OF THE INVENTION

Technical Problem

According to the present inventors' studies, it has been clarified that, for solar cell sealing materials in which a low-MFR type ethylene·α-olefin copolymer is used, there is a case where torque increases during forming and thus a sheet cannot be proficiently formed, a case where, even when a sheet can be formed, a crosslinking reaction of the solar cell sealing material does not sufficiently progresses at the time of sealing a solar cell element, or the like.

That is, according to the present inventors' studies, it has been clarified that, for solar cell sealing materials in which a low-MFR type ethylene·α-olefin copolymer is used, there is room for improvement in terms of having a favorable formability and obtaining a favorable crosslinking characteristic.

The present invention has been made in consideration of the above-described circumstance, and an object of the present invention is to provide a solar cell sealing material made of a low-MFR type ethylene·α-olefin copolymer which is excellent in terms of the balance between formability and a crosslinking characteristic.

Solution to Problem

The present inventors carried out intensive studies in order to provide a solar cell sealing material made of a low-MFR type ethylene·α-olefin copolymer which is excellent in terms of the balance between formability and a crosslinking characteristic. As a result, the present inventors found that, when an organic peroxide having a one-hour half-life temperature in a range of equal to or higher than 100° C. and equal to or lower than 130° C. and an organic peroxide having a one-hour half-life temperature in a range of higher than 130° C. and equal to or lower than 160° C. are used in combination in a specific ratio as a crosslinking agent, a solar cell sealing material having a favorable formability and a favorable crosslinking characteristic can be obtained and completed the present invention.

That is, according to the present invention, solar cell sealing materials and a solar cell module described below are provided.

[1]
A solar cell sealing material that is used to seal a solar cell element, the solar cell sealing material including:
  an ethylene·α-olefin copolymer;
  an organic peroxide (A) having a one-hour half-life temperature in a range of equal to or higher than 100° C. and equal to or lower than 130° C.; and
  an organic peroxide (B) having a one-hour half-life temperature in a range of higher than 130° C. and equal to or lower than 160° C.,
  in which a ratio $(X_2/X_1)$ of a content $X_2$ of the organic peroxide (B) to a content $X_1$ of the organic peroxide (A) in the solar cell sealing material is equal to or more than 0.05 and equal to or less than 1.10.

[2]
The solar cell sealing material according to [1],
  in which MFR of the ethylene·α-olefin copolymer, which is on the basis of ASTM D1238 and measured under conditions of 190° C. and a load of 2.16 kg, is equal to or more than 0.1 g/10 minutes and less than 10 g/10 minutes.

[3]
The solar cell sealing material according to [1] or [2],
  in which a total amount of the content $X_1$ of the organic peroxide (A) and the content $X_2$ of the organic peroxide (B) in the solar cell sealing material is equal to or more than 0.1 parts by mass and equal to or less than 3.0 parts by mass with respect to 100 parts by mass of the ethylene·α-olefin copolymer.

[4]
The solar cell sealing material according to any one of [1] to [3], in which a gel fraction is equal to or more than 55% and equal to or less than 100%.

[5]

The solar cell sealing material according to any one of [1] to [4], in which the organic peroxide (A) includes at least one kind selected from peroxyketals and peroxycarbonates.

[6]

The solar cell sealing material according to [5], in which the organic peroxide (A) includes peroxyketals, and the peroxyketals include 1,1-di(t-butylperoxy)cyclohexane.

[7]

The solar cell sealing material according to any one of [1] to [6], in which the organic peroxide (B) includes dialkyl peroxides.

[8]

The solar cell sealing material according to [7], in which the organic peroxide (B) includes dialkyl peroxides, and the dialkyl peroxides include 2,5-dimethyl-2,5-di(t-butylperoxy)hexane.

[9]

The solar cell sealing material according to any one of [1] to [8], in which the ethylene·α-olefin copolymer satisfies at least one of requirements a1) and a2) below.

a1) A density measured on the basis of ASTM D1505 is 0.865 to 0.895 g/cm$^3$.

a2) A shore A hardness measured on the basis of ASTM D2240 is 60 to 95.

[10]

The solar cell sealing material according to any one of [1] to [9], the solar cell sealing material further including:

a silane coupling agent, in which a content of the silane coupling agent in the solar cell sealing material is equal to or more than 0.1 parts by mass and equal to or less than 5.0 parts by mass with respect to 100 parts by mass of the ethylene·α-olefin copolymer.

[11]

The solar cell sealing material according to any one of [1] to [10], the solar cell sealing material further including:

a crosslinking aid, in which a content of the crosslinking aid in the solar cell sealing material is equal to or more than 0.1 parts by mass and equal to or less than 3.0 parts by mass with respect to 100 parts by mass of the ethylene·α-olefin copolymer.

[12]

The solar cell sealing material according to any one of [1] to [11], in which the solar cell sealing material has a sheet shape.

[13]

A solar cell module including:

a front surface-side transparent protective member;

a rear surface-side protective member;

a solar cell element; and a sealing layer which is made of a crosslinked substance of the solar cell sealing material according to any one of [1] to [12] and seals the solar cell element between the front surface-side transparent protective member and the rear surface-side protective member.

Advantageous Effects of Invention

According to the present invention, it is possible to provide a solar cell sealing material made of a low-MFR type ethylene·α-olefin copolymer which is excellent in terms of the balance between formability and a crosslinking characteristic.

BRIEF DESCRIPTION OF THE DRAWINGS

The above-described object, other objects, characteristics and advantages will be further clarified using a preferred embodiment described below and the following drawing accompanied by the preferred embodiment.

FIG. 1 is a cross-sectional view schematically showing a typical embodiment of a solar cell module of the present invention.

DESCRIPTION OF EMBODIMENTS

Hereinafter, an embodiment of the present invention will be described using a drawing. Unless particularly otherwise described, a numeric range "A to B" indicates equal to or more than A and equal to or less than B.

1. Regarding Solar Cell Sealing Material

A solar cell sealing material according to the present embodiment is a solar cell sealing material that is used to seal a solar cell element and includes an ethylene·α-olefin copolymer, an organic peroxide (A) having a one-hour half-life temperature in a range of equal to or higher than 100° C. and equal to or lower than 130° C., and an organic peroxide (B) having a one-hour half-life temperature in a range of higher than 130° C. and equal to or lower than 160° C.

In addition, a ratio ($X_2/X_1$) of a content $X_2$ of the organic peroxide (B) to a content $X_1$ of the organic peroxide (A) in the solar cell sealing material is equal to or more than 0.05 and equal to or less than 1.10.

As described above, according to the present inventors' studies, it has been clarified that, for solar cell sealing materials in which a low-MFR type ethylene·α-olefin copolymer is used, there is a case where torque increases during forming and thus a sheet cannot be proficiently formed, a case where, even when a sheet can be formed, a crosslinking reaction of the solar cell sealing material does not sufficiently progresses at the time of sealing a solar cell element, or the like. That is, according to the present inventors' studies, it has been clarified that, for solar cell sealing materials in which a low-MFR type ethylene·α-olefin copolymer is used, there is room for improvement in terms of having a favorable formability and obtaining a favorable crosslinking characteristic.

Therefore, the present inventors carried out intensive studies in order to provide a solar cell sealing material made of a low-MFR type ethylene·α-olefin copolymer which is excellent in terms of the balance between formability and a crosslinking characteristic. As a result, it was found that, when an organic peroxide having a one-hour half-life temperature in a range of equal to or higher than 100° C. and equal to or lower than 130° C. and an organic peroxide having a one-hour half-life temperature in a range of higher than 130° C. and equal to or lower than 160° C. are used in combination in a specific ratio as a crosslinking agent, a solar cell sealing material having a favorable formability and a favorable crosslinking characteristic can be obtained.

That is, in the solar cell sealing material according to the present embodiment, when the ratio ($X_2/X_1$) of the content $X_2$ of the organic peroxide (B) to the content $X_1$ of the organic peroxide (A) is set to equal to or more than 0.05 and equal to or less than 1.10, it is possible to make the balance between formability and a crosslinking characteristic favorable.

The reason therefor is not clear, but is considered that, the organic peroxide (B) having a one-hour half-life temperature in a range of higher than 130° C. and equal to or lower than 160° C. acts as a lubricant that reduces the friction of the ethylene·α-olefin copolymer during melting and kneading, whereby shear heating during melting and kneading can be suppressed, and, consequently, it is possible to suppress gelation during melting and kneading while maintaining the favorable crosslinking characteristic of the organic peroxide (A) and the organic peroxide (B).

First, the low-MFR type ethylene·α-olefin copolymer has a large molecular weight and is easily heated by shear during melting and kneading, and thus it is considered that an unexpected crosslinking reaction easily progresses. Therefore, it is inferred that, for the solar cell sealing material in which the low-MFR type ethylene·α-olefin copolymer is used, there is a case where torque increases during forming and thus a sheet cannot be proficiently formed.

However, the organic peroxide (B) having a one-hour half-life temperature in a range of higher than 130° C. and equal to or lower than 160° C. has a high one-hour half-life temperature and thus does not easily thermally decompose during melting and kneading. Therefore, it is considered that, during melting and kneading, the organic peroxide (B) acts as a lubricant that reduces the friction of the ethylene·α-olefin copolymer, and, consequently, the shear heating of the ethylene·α-olefin copolymer during melting and kneading can be suppressed. In addition, the organic peroxide (B) acts as a lubricant at the time of forming the solar cell sealing material, but also acts as a crosslinking agent at the time of sealing a solar cell element using the solar cell sealing material, and thus the improvement in the crosslinking characteristic of the solar cell sealing material can also be expected. Furthermore, the organic peroxide (B) bonds to the ethylene·α-olefin copolymer as a crosslinking agent in a solar cell module and does not have any adverse influence in a solar cell module, and the organic peroxide (B) is more preferred than a lubricant that is generally used in a polyolefin-based resin from the viewpoint of the reliability of a solar cell module.

Therefore, in the solar cell sealing material according to the present embodiment, when the ratio $(X_2/X_1)$ of the content $X_2$ of the organic peroxide (B) to the content $X_1$ of the organic peroxide (A) is equal to or more than the above-described lower limit value, gelation during melting and kneading is suppressed, and it is possible to improve the balance between formability and the crosslinking characteristic.

In addition, in the solar cell sealing material according to the present embodiment, when the ratio $(X_2/X_1)$ of the content $X_2$ of the organic peroxide (B) to the content $X_1$ of the organic peroxide (A) is equal to or less than the above-described upper limit value, the proportion of the organic peroxide (A) having an excellent crosslinking characteristic increases, and thus it is possible to improve the crosslinking characteristic of the solar cell sealing material. Furthermore, it is possible to decrease the total amount of the organic peroxide (A) and the organic peroxide (B), and thus the gelation of the ethylene·α-olefin copolymer can be suppressed during melting and kneading, and consequently, formability can be improved.

On the basis of the above description, in the solar cell sealing material according to the present embodiment, when the ratio $(X_2/X_1)$ of the content $X_2$ of the organic peroxide (B) to the content $X_1$ of the organic peroxide (A) is equal to or more than 0.05 and equal to or less than 1.10, it is possible to suppress the gelation of the ethylene·α-olefin copolymer during forming, and consequently, it is possible to make the balance between formability and the crosslinking characteristic favorable.

In the solar cell sealing material according to the present embodiment, the lower limit value of the ratio $(X_2/X_1)$ of the content $X_2$ of the organic peroxide (B) to the content $X_1$ of the organic peroxide (A) is equal to or more than 0.05, but is preferably equal to or more than 0.08, more preferably equal to or more than 0.10, still more preferably equal to or more than 0.12, and particularly preferably equal to or more than 0.14 from the viewpoint of further suppressing the occurrence of gelation during forming and further improving formability.

In the solar cell sealing material according to the present embodiment, the upper limit value of the ratio $(X_2/X_1)$ of the content $X_2$ of the organic peroxide (B) to the content $X_1$ of the organic peroxide (A) is equal to or less than 1.10, but is preferably equal to or less than 1.00, more preferably equal to or less than 0.90, and still more preferably equal to or less than 0.80 from the viewpoint of further suppressing the occurrence of gelation during forming and further improving formability.

The lower limit value of the total amount of the content $X_1$ of the organic peroxide (A) and the content $X_2$ of the organic peroxide (B) in the solar cell sealing material according to the present embodiment is preferably equal to or more than 0.1 parts by mass, more preferably equal to or more than 0.3 parts by mass, still more preferably equal to or more than 0.5 parts by mass, and particularly preferably equal to or more than 0.6 parts by mass with respect to 100 parts by mass of the ethylene·α-olefin copolymer.

When the total amount of the content $X_1$ of the organic peroxide (A) and the content $X_2$ of the organic peroxide (B) is equal to or more than the above-described lower limit value, the crosslinking characteristic of the solar cell sealing material becomes more favorable, and the heat resistance of the solar cell sealing material further improves. In addition, a graft reaction of a silane coupling agent into the main chain of the ethylene·α-olefin copolymer is made to be more favorable, whereby the heat resistance and the adhesiveness become more favorable.

In addition, the upper limit value of the total amount of the content $X_1$ of the organic peroxide (A) and the content $X_2$ of the organic peroxide (B) in the solar cell sealing material according to the present embodiment is preferably equal to or less than 3.0 parts by mass, more preferably equal to or less than 2.0 parts by mass, still more preferably equal to or less than 1.5 parts by mass, far still more preferably less than 1.3 parts by mass, and particularly preferably equal to or less than 1.2 parts by mass with respect to 100 parts by mass of the ethylene·α-olefin copolymer from the viewpoint of further suppressing the occurrence of gelation during forming and further improving formability. When the total amount of the content $X_1$ of the organic peroxide (A) and the content $X_2$ of the organic peroxide (B) is equal to or less than or less than the above-described upper limit value, the crosslinking characteristic, the heat resistance, and the adhesiveness are more favorable, and thus it is possible to further suppress gelation during the formation of a sheet and make the formability more favorable. Furthermore, the amount of a decomposition product of the organic peroxide (A) and the organic peroxide (B) generated further decreases, and it is possible to further suppress the generation of air bubbles in the solar cell sealing material.

In addition, the gel fraction of the solar cell sealing material according to the present embodiment is preferably equal to or more than 55% and equal to or less than 100%, more preferably equal to or more than 57% and equal to or less than 95%, and still more preferably equal to or more than 60% and equal to or less than 90% from the viewpoint of making the crosslinking characteristic favorable and further suppressing the occurrence of gelation during forming, thereby further improving the formability. The gel fraction can be computed using a method described below. First, 1 g of a sample of a crosslinked body that is obtained by crosslinking the solar cell sealing material is collected, put into 100 mL of xylene, and left to stand in an explosion-proof oven (110° C.) for 12 hours. Next, the sample was filtered using a stainless steel mesh (30 meshes), and the mesh was dried at 110° C. for eight hours. The mass of a residue remaining on the mesh is measured, and the ratio (%) of the mass of the residue remaining on the mesh to the amount (1 g) of the sample before the treatment is regarded as the gel fraction.

When the gel fraction is equal to more than the above-described lower limit value, the heat resistance of the solar cell sealing material becomes favorable, and it is possible to suppress the degradation of the adhesiveness at, for example, a high temperature. On the other hand, when the gel fraction is equal to or more than the above-described upper limit value, the solar cell sealing material becomes highly flexible, and the temperature followability at a high temperature improves, and thus the occurrence of peeling can be suppressed.

Hereinafter, the respective components configuring the solar cell sealing material according to the present embodiment will be described.

<Ethylene·α-Olefin Copolymer>

The solar cell sealing material according to the present embodiment includes an ethylene·α-olefin copolymer.

The ethylene·α-olefin copolymer is obtained by, for example, copolymerizing ethylene and an α-olefin having 3 to 20 carbon atoms. As the α-olefin, generally, it is possible to use an α-olefin having 3 to 20 carbon atoms alone or a combination of two or more α-olefins having 3 to 20 carbon atoms.

As the α-olefin having 3 to 20 carbon atoms, for example, linear or branched α-olefins such as propylene, 1-butene, 1-pentene, 1-hexene, 3-methyl-1-butene, 3,3-dimethyl-1-butene, 4-methyl-1-pentene, 1-octene, 1-decene, and 1-dodecene can be exemplified. Among these, an α-olefin having 10 or less carbon atoms is preferred, and an α-olefin having 3 to 8 carbon atoms is particularly preferred. From the viewpoint of easiness in procurement, propylene, 1-butene, 1-pentene, 1-hexene, 4-methyl-1-pentene, and 1-octene are preferred. The ethylene·α-olefin copolymer may be a random copolymer or a blocked copolymer, but is preferably a random copolymer from the viewpoint of flexibility.

Furthermore, the ethylene·α-olefin copolymer may be a copolymer including ethylene, an α-olefin having 3 to 20 carbon atoms, and a non-conjugated polyene. The α-olefin is the same as described above, and, as the non-conjugated polyene, for example, 5-ethylidene-2-norbornene (ENB), 5-vinyl-2-norbornene (VNB), dicyclopentadiene (DCPD), and the like are exemplified. These non-conjugated polyenes can be used singly or two or more non-conjugated polyenes can be used in combination.

Together with the ethylene·α-olefin copolymer, for example, an aromatic vinyl compound such as styrene, o-methylstyrene, m-methylstyrene, p-methylstyrene, o,p-dimethylstyrene, methoxystyrene, vinylbenzoic acid, methyl vinylbenzoate, vinyl benzyl acetate, hydroxystyrene, p-chlorostyrene, divinylbenzene, 3-phenylpropylene, 4-phenylpropylene, or α-methylstyrene; a cycloolefin having 3 to 20 carbon atoms such as cyclopentene, cycloheptene, norbornene, or 5-methyl-2-norbornene; or the like may be jointly used.

Here, as the ethylene·α-olefin copolymer, for example, TAFMER (registered trademark) manufactured by Mitsui Chemicals, Inc., ENGAGE (registered trademark) manufactured by The DOW Chemical Company, EXACT (registered trademark) manufactured by Exxon Mobil Corporation, KERNEL (registered trademark) manufactured by Japan Polyethylene Corporation, and the like are exemplified.

The melt flow rate (MFR) of the ethylene·α-olefin copolymer, which is on the basis of ASTM D1238 and measured under conditions of 190° C. and a load of 2.16 kg, is preferably equal to or more than 0.1 g/10 minutes, more preferably equal to or more than 0.5 g/10 minutes, still more preferably equal to or more than 1.0 g/10 minutes, and particularly preferably equal to or more than 2.0 g/10 minutes and preferably less than 10 g/10 minutes, more preferably less than 9.0 g/10 minutes, still more preferably less than 8.0 g/10 minutes, and particularly preferably less than 7.0 g/10 minutes.

When MFR is in the above-described range, the fluidity of a resin composition including the ethylene·α-olefin copolymer becomes low, and the contamination of a laminator by a stray molten resin at the time of laminating a solar cell sealing material sheet and a solar cell element can be prevented, which is preferable.

MFR of the ethylene·α-olefin copolymer can be adjusted by adjusting the polymerization temperature and the polymerization pressure during a polymerization reaction, the molar ratio between the monomer concentration and the hydrogen concentration of ethylene and the α-olefin in a polymerization system, and the like.

The ethylene·α-olefin copolymer preferably satisfies at least one of requirements a1) and a2) below.

(Requirement a1)

The density of the ethylene·α-olefin copolymer, which is measured on the basis of ASTM D1505, is preferably equal to or more than 0.865 $g/cm^3$, more preferably equal to or more than 0.866 $g/cm^3$, and still more preferably equal to or more than 0.867 $g/cm^3$ and preferably equal to or less than 0.895 $g/cm^3$, more preferably equal to or less than 0.890 $g/cm^3$, still more preferably equal to or less than 0.884 $g/cm^3$, and particularly preferably equal to or less than 0.880 $g/cm^3$.

The density of the ethylene·α-olefin copolymer can be adjusted using the balance between the content proportion of an ethylene unit and the content proportion of an α-olefin unit. That is, when the content proportion of the ethylene unit is increased, the crystallinity becomes high, and an ethylene·α-olefin copolymer having a high density can be obtained. On the other hand, when the content proportion of the ethylene unit is decreased, the crystallinity becomes low, and an ethylene·α-olefin copolymer having a low density can be obtained.

When the density of the ethylene·α-olefin copolymer is equal to or less than the above-described upper limit value, the crystallinity becomes more appropriate, and it is possible to further enhance the transparency of a solar cell sealing material to be obtained. Furthermore, it is possible to make the crosslinking characteristic more favorable. In addition, it is possible to make the flexibility more favorable and further suppress the occurrence of the cracking of a solar cell element, the chipping of a thin film electrode, or the like during lamination forming.

On the other hand, when the density of the ethylene·α-olefin copolymer is equal to or more than the above-described lower limit value, it is possible to increase the crystallization rate of the ethylene·α-olefin copolymer, and thus a sheet extruded using an extruder does not easily stick, peeling from a cooling roll becomes easy, and a sheet of the solar cell sealing material can be easily obtained. In addition, the sheet does not easily stick, and thus the occurrence of blocking is suppressed, and the feedability of a sheet can be improved. In addition, the sheet can be sufficiently crosslinked, and thus it is possible to suppress the degradation of the heat resistance of the solar cell sealing material.
(Requirement a2)

The shore A hardness of the ethylene·α-olefin copolymer, which is measured on the basis of ASTM D2240, is preferably equal to or more than 60, more preferably equal to or more than 62, still more preferably equal to or more than 63, and particularly preferably equal to or more than 65 and preferably equal to or less than 95, more preferably equal to or less than 90, still more preferably equal to or less than 85, and particularly preferably equal to or less than 80. The shore A hardness of the ethylene·α-olefin copolymer can be adjusted by controlling the numeric range of the content proportion of the ethylene unit or the density of the ethylene·α-olefin copolymer. That is, the shore A hardness of an ethylene·α-olefin copolymer having a high content proportion of the ethylene unit and a high density becomes high. On the other hand, the shore A hardness of an ethylene·α-olefin copolymer having a low content proportion of the ethylene unit and a low density becomes low.

When the shore A hardness is equal to or more than the above-described lower limit value, the production of a sheet is easy, a sheet having favorable blocking resistance can be obtained, and, furthermore, the heat resistance can also be improved.

On the other hand, when the shore A hardness is equal to or less than the above-described upper limit value, it is possible to improve the transparency and the flexibility and facilitate the formation of a sheet.

In the solar cell sealing material according to the present embodiment, the content of the ethylene·α-olefin copolymer is preferably equal to or more than 80% by mass, more preferably equal to or more than 90% by mass, still more preferably equal to or more than 95% by mass, and particularly preferably 100% by mass when all of a resin component included in the solar cell sealing material is set to 100% by mass. In such a case, it is possible to obtain a solar cell sealing material having a more favorable balance among a variety of characteristics such as transparency, adhesiveness, heat resistance, flexibility, appearance, the crosslinking characteristic, the electric characteristic, and extrusion formability.

In the solar cell sealing material according to the present embodiment, the content of the resin component is preferably equal to or more than 40% by mass, more preferably equal to or more than 50% by mass, still more preferably equal to or more than 60% by mass, far still more preferably equal to or more than 70% by mass, far still more preferably equal to or more than 80% by mass, and particularly preferably 90% by mass when all of the solar cell sealing material is set to 100% by mass. In such a case, it is possible to obtain a solar cell sealing material having a more favorable balance among a variety of characteristics such as transparency, adhesiveness, heat resistance, flexibility, appearance, the crosslinking characteristic, the electric characteristic, and extrusion formability.

<Organic Peroxide (A)>

The solar cell sealing material according to the present embodiment includes an organic peroxide (A) having a one-hour half-life temperature in a range of equal to or higher than 100° C. and equal to or lower than 130° C. as a crosslinking agent.

When the organic peroxide (A) having a one-hour half-life temperature in a range of equal to or higher than 100° C. and equal to or lower than 130° C. is contained in the solar cell sealing material according to the present embodiment, the crosslinking rate of the ethylene·α-olefin copolymer improves, and the total amount of a crosslinking agent being used can be decreased, and thus it is possible to obtain excellent effects such as a capability of suppressing the generation of gel during forming and a capability of improving the formability.

The organic peroxide (A) is not particularly limited as long as the organic peroxide has a one-hour half-life temperature in a range of equal to or higher than 100° C. and equal to or lower than 130° C., but at least one kind selected from peroxyketals and peroxycarbonates is preferably included.

As the peroxyketals, for example, 2,2-di(t-butylperoxy)butane, n-butyl-4,4-di(t-butylperoxy)valerate, ethyl-3,3-di(t-butylperoxy)butyrate, 2,2-di(t-amylperoxy)butane, 1,1-di(t-butylperoxy)cyclohexane, 1,1-di(t-amylperoxy)cyclohexane, 1,1-di(t-hexylperoxy)cyclohexane, 1,1-di(t-butylperoxy)-2-methylcyclohexane, 1,1-di(t-amylperoxy)-2-methylcyclohexane, 1,1-di(t-hexylperoxy)-2-methylcyclohexane, 1,1-di(t-butylperoxy)-3,3,5-trimethylcyclohexane, 1,1-di(t-amylperoxy)-3,3,5-trimethylcyclohexane, 1,1-di(t-hexylperoxy)-3,3,5-trimethylcyclohexane, 2,2-di(4,4-di-(t-butylperoxy)cyclohexyl)propane, and the like are exemplified.

As the peroxycarbonates, for example, di-n-propyl peroxydicarbonate, diisopropyl peroxycarbonate, di-4-t-butylcyclohexyl peroxycarbonate, di-2-ethylhexyl peroxycarbonate, di-sec-butyl peroxycarbonate, di-3-methoxybutyl peroxydicarbonate, di-2-ethylhexyl peroxydicarbonate, diisopropyl peroxydicarbonate, t-amyl peroxyisopropyl carbonate, t-butyl peroxyisopropyl carbonate, t-butyl peroxy-2-ethylhexyl carbonate, 1,6-bis(t-butylperoxycarbonyloxy)hexane, and the like are exemplified.

Among these, the organic peroxide (A) is preferably a peroxyketal and more preferably 1,1-di(t-butylperoxy)cyclohexane from the viewpoint of an excellent crosslinking characteristic.

<Organic Peroxide (B)>

The solar cell sealing material according to the present embodiment includes an organic peroxide (B) having a one-hour half-life temperature in a range of higher than 130° C. and equal to or lower than 160° C. as a crosslinking agent.

When the organic peroxide (B) having a one-hour half-life temperature in a range of higher than 130° C. and equal to or lower than 160° C. is contained in the solar cell sealing material according to the present embodiment, shear heating is suppressed during melting and kneading, and it is possible to suppress a crosslinking reaction of the ethylene·α-olefin copolymer by shear heating. Therefore, it is possible to obtain excellent effects such as a capability of suppressing the occurrence of gelation during forming and a capability of improving the formability.

The organic peroxide (B) is not particularly limited as long as the organic peroxide has a one-hour half-life temperature in a range of higher than 130° C. and equal to or lower than 160° C., but dialkyl peroxides are preferably included.

As the dialkyl peroxides, for example, dicumyl peroxide, 2,5-dimethyl-2,5-di(t-butylperoxy)hexane, 1,3-bis(t-butylperoxyisopropyl)hexane, t-butylcumyl peroxide, di-t-butyl peroxide, di-t-hexyl peroxide, 2,5-dimethyl-2,5-di(t-butylperoxy)hexyne-3, and the like are exemplified.

Among these, the organic peroxide (B) is more preferably 2,5-dimethyl-2,5-di(t-butylperoxy)hexane from the viewpoint of an excellent crosslinking characteristic.

<Crosslinking Aid>

The solar cell sealing material according to the present embodiment may further contain a crosslinking aid from the viewpoint of improving the crosslinking characteristic.

As the crosslinking aid, it is possible to use, for example, one or more selected from the group consisting of a divinyl aromatic compound, a cyanurate compound, a diallyl compound, an acrylate compound, a triallyl compound, an oxime compound, and a maleimide compound.

The content of the crosslinking aid in the solar cell sealing material according to the present embodiment is equal to or less than 3.0 parts by mass, preferably equal to or less than 2.0 parts by mass, and particularly preferably equal to or less than 1.5 parts by mass with respect to 100 parts by mass of the ethylene·α-olefin copolymer.

In addition, the content of the crosslinking aid in the solar cell sealing material according to the present embodiment is equal to or more than 0.1 parts by mass, preferably equal to or more than 0.3 parts by mass, and more preferably equal to or more than 0.5 parts by mass with respect to 100 parts by mass of the ethylene·α-olefin copolymer. In such a case, it is possible to produce an appropriate crosslinking structure and improve the heat resistance, mechanical properties, and adhesiveness of the solar cell sealing material.

As the divinyl aromatic compound, for example, divinylbenzene, di-i-propenylbenzene, and the like are exemplified.

As the cyanurate compound, for example, triallyl cyanurate, triallyl isocyanurate, and the like are exemplified.

As the diallyl compound, for example, diallyl phthalate and the like are exemplified.

As the triallyl compound, for example, pentaerythritol triallyl ether and the like are exemplified.

As the acrylate compound, for example, diethylene glycol diacrylate, triethylene glycol diacrylate, dipropylene glycol diacrylate, tripropylene glycol diacrylate, trimethylolpropane tri(meth)acrylate, ditrimethylolpropane tetra(meth)acrylate, tetramethylolmethane tetra(meth)acrylate, tetramethylolmethane tetra(meth)acrylate, and the like are exemplified.

As the oxime compound, for example, p-quinonedioxime, p-p'-dibenzoylquinonedioxime, and the like are exemplified.

As the maleimide compound, for example, m-phenylene dimaleimide and the like are exemplified.

As the crosslinking aid, a compound having three or more crosslinkable unsaturated bonds such as a vinyl group in a molecule is preferred, and, particularly, triallyl cyanurate, triallyl isocyanurate, trimethylolpropane tri(meth)acrylate, and ditrimethylolpropane tetra(meth)acrylate are preferred since the crosslinking characteristic is favorable.

<Silane Coupling Agent>

The solar cell sealing material according to the present embodiment may further include a silane coupling agent.

The content of the silane coupling agent in the solar cell sealing material according to the present embodiment is preferably equal to or more than 0.1 parts by mass and equal to or more than 5.0 parts by mass, more preferably equal to or more than 0.1 parts by mass and equal to or more than 4.0 parts by mass, and particularly preferably equal to or more than 0.1 parts by mass and equal to or more than 3.0 parts by mass with respect to 100 parts by mass of the ethylene·α-olefin copolymer.

When the content of the silane coupling agent is equal to or more than the above-described lower limit value, it is possible to make the adhesion strength between the solar cell sealing material and a different member more favorable. On the other hand, when the content of the silane coupling agent is equal to or less than the above-described upper limit value, the balance between costs and performance is favorable, and the degradation of moisture permeability can also be prevented. In addition, in the case of being used as the solar cell sealing material, the adhesion between a front surface-side transparent protective member, a solar cell element, an electrode, and a rear surface-side solar cell sealing material becomes favorable, and the adhesiveness also improves. In addition, the silane coupling agent causes a condensation reaction, is present as a white string in the solar cell sealing material, and is capable of suppressing the deterioration of the product appearance.

The silane coupling agent is not particularly limited, and it is possible to use, for example, one or more selected from vinyltriethoxysilane, vinyltrimethoxysilane, vinyltris(β-methoxyethoxysilane), 2-(3,4-epoxycyclohexyl)ethyltrimethoxysilane, 3-glycidoxypropylmethyldimethoxysilane, 3-glycidoxypropyl trimethoxysilane, 3-glycidoxypropylmethyldiethoxysilane, 3-glycidoxypropyltriethoxysilane, p-styryltrimethoxysilane, 3-aminopropyltriethoxysilane, 3-aminopropyltrimethoxysilane, N-2-(aminoethyl)-3-aminopropylmethyldimethoxysilane, N-2-(aminoethyl)-3-aminopropyltrimethoxysilane, 3-triethoxysilyl-N-(1,3-dimethyl-butylidene)propylamine, N-phenyl-3-aminopropyltrimethoxysilane, 3-ureidopropyltriethoxysilane, 3-isocyanatepropyltriethoxysilane, 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-acryloxypropyltrimethoxysilane, and the like. Preferably, it is possible to use one or more selected from 3-glycidoxypropyltrimethoxysilane, 3-glycidoxypropyltriethoxysilane, 3-aminopropyltriethoxysilane, 3-methacryloxypropyltrimethoxysilane, 3-methacryloxypropyltriethoxysilane, 3-acryloxypropyltrimethoxysilane, vinyltriethoxysilane, which have favorable adhesiveness, and the like.

<Ultraviolet Absorber, Light Stabilizer, and Heat-Resistant Stabilizer>

The solar cell sealing material according to the present embodiment may further contain at least one additive selected from an ultraviolet absorber, a light stabilizer, and a heat-resistant stabilizer. The amount of these additives blended is preferably equal to or more than 0.005 parts by mass and equal to or less than 5 parts by mass with respect to 100 parts by mass of the ethylene·α-olefin copolymer. Furthermore, the solar cell sealing material preferably contains at least two additives selected from the three additives and particularly preferably contains all of the three additives. When the amount of the additive blended is in the above-described range, an effect for improving weather-resistant stability and heat-resistant stability is sufficiently ensured, and it is possible to prevent the degradation of transparency or adhesiveness to a glass plate, which is preferable.

As the ultraviolet absorber, it is possible to use, for example, one or more selected from benzophenone-based ultraviolet absorbers such as 2-hydroxy-4-normal-octyloxybenzophenone, 2-hydroxy-4-methoxybenzophenone, 2,2-dihydroxy-4-methoxybenzophenone, 2-hydroxy-4-methoxy-2-carboxybenzophenone, and 2-hydroxy-4-N-octoxybenzophenone; benzotriazole-based ultraviolet absorbers such as 2-(2-hydroxy-3,5-di-t-butylphenyl)benzotriazole, 2-(2-hydroxy-5-methylphenyl)benzotriazole, 2-(2-hydroxy-5-t-octylphenyl)benzotriazole; salicylic acid ester-based ultraviolet absorbers such as phenyl salicylate and p-octylphenyl salicylate; and the like.

As the light stabilizer, it is possible to use, for example, one or more selected from hindered amine-based compounds such as bis(2,2,6,6-tetramethyl-4-piperidyl)sebacate, poly[{6-(1,1,3,3-tetramethylbutyl)amino-1,3,5-triazine-2,4-diyl}{(2,2,6,6-tetramethyl-4-piperidyl) imino}hexamethylene{(2,2,6,6-t etramethyl-4-piperidyl) imino}], hindered piperidine-based compounds, and the like.

As the heat-resistant stabilizer, it is possible to use, for example, one or more selected from phosphite-based antioxidants such as tris(2,4-di-tert-butylphenyl)phosphite, bis [2,4-bis(1,1-dimethylethyl)-6-methylphenyl]ethyl ester phosphorous acid, tetrakis(2,4-di-tert-butylphenyl) [1,1-biphenyl]-4,4'-diylbisphos phonite, and bis(2,4-di-tert-butylphenyl)pentaerythritol diphosphate; lactone-based antioxidants such as a reaction product between 3-hydroxy-5,7-di-tert-butyl-furan-2-one and o-xylene; hindered phenol-based antioxidants such as 3,3',3",5,5',5"-hexa-tert-butyl-a,a',a"-(methylene-2,4,6-triy 1)tri-p-cresol, 1,3,5-trimethyl-2,4,6-tris(3,5-di-ter-butyl-4-hydroxyphenyl)benz ylbenzene, pentaerythritol tetrakis[3-(3,5-di-tert-butyl-4-hydroxyphenyl)propionate], octadecyl-3-(3,5-di-tert-butyl-4-hydroxyphenyl)propionate, and thiodiethylenebis[3-(3,5-di-tert-butyl-4-hydroxyphenyl)propionat e]; sulfur-based antioxidants; amines-based antioxidants; and the like. Among these, phosphite-based antioxidants and hindered phenol-based antioxidants are preferred.

<Solar Cell Sealing Material Sheet>

The solar cell sealing material according to the present embodiment having a sheet shape as the overall shape is also one of the preferred embodiments.

The thickness of a solar cell sealing material sheet (sheet-shaped solar cell sealing material) in the present embodiment is not particularly limited, but is preferably equal to or more than 0.01 mm and equal to or less than 2.0 mm and more preferably equal to or more than 0.2 mm and equal to or less than 1.2 mm. When the thickness is in the above-described range, it is possible to suppress the breakage of a light-receiving surface-side protective member, a solar cell element, a thin film electrode, and the like in a lamination step and obtain a higher light power generation amount by ensuring a sufficient light transmittance. Furthermore, it is possible to make the laminate formation of a solar cell module at a low temperature favorable, which is preferred.

In the solar cell sealing material sheet according to the present embodiment, other layers may be laminated as long as the object of the present invention is not impaired. For example, the solar cell sealing material sheet may have layers such as a hardcoat layer for protecting the front surface or the rear surface, an adhesive layer, an antireflection layer, a gas barrier layer, and an antifouling layer. In the case of classifying the layers on the basis of the material, a layer made of an ultraviolet-curable resin, a layer made of a thermosetting resin, a layer made of a polyolefin resin, a layer made of a carboxylic acid-modified polyolefin resin, a layer made of a fluorine-containing resin, a layer made of a cyclic olefin (co)polymer, a layer made of an inorganic compound, and the like can be exemplified.

<Method for Manufacturing Solar Cell Sealing Material Sheet>

A method for manufacturing the solar cell sealing material sheet according to the present embodiment is not particularly limited, and it is possible to employ a variety of well-known forming methods (cast forming, extrusion sheet forming, inflation forming, injection forming, compression forming, calender forming, and the like). Among these, extrusion sheet forming and calender forming are preferred.

The method for manufacturing the solar cell sealing material sheet according to the present embodiment is not particularly limited; however, for example, the following method is exemplified. First, the ethylene·α-olefin copolymer, the organic peroxide (A), the organic peroxide (B), as necessary, the crosslinking aid, the silane coupling agent, the ultraviolet absorber, the light stabilizer, the heat-resistant stabilizer, and, furthermore, as necessary, other additives are manually blended or blended using a stirring and blending device such as a Henschel mixer, a tumbler, or a super mixer in, for example, a bag such as a plastic bag.

Next, the obtained resin composition is supplied to, for example, a hopper in an extrusion sheet forming machine and melted and kneaded. After that, the resin composition is extrusion-formed in a sheet shape from a T die of the extrusion sheet forming machine, thereby obtaining a solar cell sealing material sheet. The sheet can be formed using a well-known method in which a calender forming machine, an inflation forming machine, or the like is used.

In addition, it is also possible to produce a solar cell sealing material sheet not including any organic peroxides using the above-described method and add the organic peroxide (A) and the organic peroxide (B) to the produced sheet using an impregnation method.

It is also possible to inject the resin composition into the extrusion sheet forming machine and then add some of the additives thereto in the middle of melting and kneading.

2. Regarding Solar Cell Module

The solar cell sealing material according to the present embodiment is used to seal a solar cell element in a solar cell module.

As a configuration of the solar cell module, for example, a configuration in which a front surface-side transparent protective member, a light-receiving surface-side sealing layer, a solar cell element, a rear surface-side sealing layer, and a rear surface-side protective member (backsheet) are laminated in this order is exemplified, but the configuration is not particularly limited.

A crosslinked substance of the solar cell sealing material according to the present embodiment is used for any one or both of the light-receiving surface-side sealing layer and the rear surface-side sealing layer.

FIG. 1 shows an example of the cross-sectional view of a solar cell module 10 according to the present embodiment.

The solar cell module 10 includes a solar cell element 13, a pair of a light-receiving surface-side sealing layer 11 and a rear surface-side sealing layer 12 that sandwich and seal the solar cell element 13, a front surface-side transparent protective member 14, and a rear surface-side protective member (backsheet) 15.

(Solar Cell Element)

As the solar cell element 13, it is possible to use, for example, a variety of solar cell elements such as a silicon-based semiconductor system made of single-crystal silicon, polycrystal silicon, or amorphous silicon and a III-V group or II-VI group compound semiconductor system made of gallium-arsenic, copper-indium-selenium, or cadmium-tellurium.

In the solar cell module 10, a plurality of the solar cell elements 13 is electrically connected to each other in series through an interconnector 16 including a conductive wire and a solder joint portion.

(Front Surface-Side Transparent Protective Member)

As the front surface-side transparent protective member 14, for example, a glass plate; a resin plate formed of an acrylic resin, polycarbonate, polyester, a fluorine-containing resin, or the like; and the like are exemplified.

(Rear Surface-Side Protective Member)

As the rear surface-side protective member (backsheet) 15, for example, a single body sheet or a multilayer sheet of metal, a variety of thermoplastic resin films, or the like is exemplified. For example, metal such as silver, aluminum, and stainless steel; an inorganic material such as glass; a variety of thermoplastic resin films formed of polyester, inorganic substance-deposited polyester, a fluorine-containing resin, a polyolefin, or the like; and the like are exemplified.

The rear surface-side protective member 15 may be a single layer or a multilayer.

(Method for Manufacturing Solar Cell Module)

A method for manufacturing the solar cell module 10 according to the present embodiment is not particularly limited, and, for example, the following method is exemplified.

First, the plurality of solar cell elements 13 electrically connected to each other using the interconnector 16 is sandwiched by a pair of the solar cell sealing materials, and, furthermore, a pair of the solar cell sealing materials is sandwiched by the front surface-side transparent protective member 14 and the rear surface-side protective member 15, thereby producing a laminate. Next, the laminate is heated in a state in which the solar cell elements 13 is sandwiched by a pair of the solar cell sealing materials, thereby sealing the solar cell element 13 between a pair of the solar cell sealing materials. That is, a pair of the solar cell sealing materials are respectively crosslinked by heating the obtained laminate to respectively form the light-receiving surface-side sealing layer 11 and the rear surface-side sealing layer 12, thereby sealing the solar cell element 13 between the light-receiving surface-side sealing layer 11 and the rear surface-side sealing layer 12. Furthermore, the light-receiving surface-side sealing layer 11 and the rear surface-side sealing layer 12, the light-receiving surface-side sealing layer 11 and the front surface-side transparent protective member 14, and the rear surface-side sealing layer 12 and the rear surface-side protective member 15 are adhered to each other. Here, the solar cell sealing material according to the present embodiment is used for any one or both of a pair of the solar cell sealing materials.

More specifically, the solar cell sealing material is heated to a temperature at which the crosslinking agent included in the solar cell sealing material substantially does not decompose and the ethylene·α-olefin copolymer melts, and the light-receiving surface-side sealing layer 11 and the rear surface-side sealing layer 12, the light-receiving surface-side sealing layer 11 and the front surface-side transparent protective member 14, and the rear surface-side sealing layer 12 and the rear surface-side protective member 15 are respectively temporarily adhered to each other. Next, the layers and the members are heated to be sufficiently adhered to each other, and, furthermore, the ethylene·α-olefin copolymer in the sealing layers is crosslinked. The temperature for adhesion and crosslinking needs to be a temperature at which a satisfactory crosslinking rate is obtained and swelling does not occur and, for example, can be set in a temperature range of approximately 100° C. to 180° C.

Hitherto, the embodiment of the present invention has been described with reference to the drawing, but the embodiment is an example of the present invention, and a variety of other configurations can also be employed.

Examples

Hereinafter, the present invention will be specifically described on the basis of examples, but the present invention is not limited to these examples.

(1) Ethylene·α-Olefin Copolymer

As an ethylene·α-olefin copolymer, TAFMER (registered trademark) A-4070S manufactured by Mitsui Chemicals, Inc. was used. The properties of TAFMER (registered trademark) A-4070S are as described below.

Density: 0.870 g/cm$^3$

MFR: 3.6 g/10 minutes

Shore A hardness: 73

Here, MFR of the ethylene·α-olefin copolymer were measured on the basis of ASTM D1238 under conditions of 190° C. and a load of 2.16 kg.

In addition, the density of the ethylene·α-olefin copolymer was measured on the basis of ASTM D1505.

In addition, the shore A hardness of the ethylene·α-olefin copolymer was measured in the following order.

First, the ethylene·α-olefin copolymer was heated at 190° C. for four minutes, pressurized at 10 MPa, and then pressurized and cooled to room temperature at 10 MPa for five minutes, thereby obtaining a 3 mm-thick sheet. The shore A hardness of the ethylene·α-olefin copolymer was measured on the basis of ASTM D2240 using the obtained sheet.

(2) Production of Solar Cell Sealing Material

In a microrheology compound (MiniLaboII HAAKE Rehnomex CTW5 manufactured by Thermo Fisher Scientific), under conditions of 125° C. and a screw rotation speed of 30 rpm, the ethylene·α-olefin copolymer, the organic peroxide (A), the organic peroxide (B), a crosslinking aid, and a silane coupling agent were blended together according to formulations shown in Table 1, melted, and kneaded, thereby respectively producing 4 mm-wide strand-shape solar cell sealing materials.

The units of the blending proportions of the respective components in Table 1 are "parts by mass". In addition, the details of the components other than the ethylene·α-olefin copolymer in Table 1 are as described below.

Organic peroxide (A-1): 1,1-Di(t-butylperoxy)cyclohexane (one-hour half-life temperature: 116° C., PERHEXA (registered trademark) C-80, manufactured by NOF Corporation)

Organic peroxide (B-1): 2,5-Dimethyl-2,5-di(t-butylperoxy)hexane (one-hour half-life temperature: 140° C., LUPEROX101, manufactured by Arkema Yoshitomi, Ltd.)

Crosslinking aid 1: Triallyl isocyanurate

Silane coupling agent 1: 3-Methacryloxypropyltrimethoxysilane (3) Evaluation of Formability of Solar Cell Sealing Material The formability of the solar cell sealing material was evaluated by measuring scorch time.

Resin compositions of examples and comparative examples were kneaded in the microrheology compound (MiniLaboII HAAKE Rehnomex CTW5 manufactured by Thermo Fisher Scientific) under conditions of 125° C. and a screw rotation speed of 30 rpm, the times taken for the torque to increase by 0.1 Nm from the minimum value were measured, and these times were regarded as scorch times.

Next, the formability of the solar cell sealing materials was evaluated using the following standards. Here, it is experimentally confirmed that, in a case where the scorch time is shorter than 14 minutes, a significant increase in torque is observed, and the formability of the resin composition is poor.

A: The scorch time is equal to or longer than 20 minutes.
B: The scorch time is equal to or longer than 14 minutes and shorter than 20 minutes.
C: The scorch time is equal to or longer than 12 minutes and shorter than 14 minutes.
D: The scorch time is shorter than 12 minutes.

(4) Evaluation of Crosslinking Characteristic of Solar Cell Sealing Material

The crosslinking characteristic of the solar cell sealing material was evaluated using the gel fraction.

The obtained strand-shape solar cell sealing material was cut to a length of 5 to 10 mm, and 5 to 6 g of the cut solar cell sealing material was sandwiched by silica-coated PET films. At this time, the PET films sandwiched the strand-shape solar cell sealing material so that the silica-coated surfaces faced the solar cell sealing material respectively. Next, the obtained laminate was sandwiched by 1 mm-thick SUS plates. Next, the laminate sandwiched by the SUS plates was injected into a mini test press (manufactured by Toyo Seiki Seisaku-Sho, Ltd., MP-SCL) having hot plates set to a temperature of 150° C., pressed at a press pressure of 5 MPa, and was subjected to a degassing operation after one minute from the start of pressurization. In the degassing operation, an operation of applying pressure to the laminate up to 8 MPa and then reducing the pressure (the pressure was reduced to zero by lifting an upper hot plate) was repeated eight times within 30 seconds. After the degassing operation, the press pressure was fixed to 11±1 MPa. The laminate was injected into the press, the laminate sandwiched by the SUS plates was removed after 10 minutes (including the degassing operation time) from the start of the pressurization, and the PET films were peeled off from the obtained laminate, thereby obtaining a sheet-shape crosslinked body having a thickness of 0.02 to 0.04 mm.

Approximately 1 g of the produced crosslinked body was weighed (the weighed value is represented by A (g)), put into 100 mL of xylene, and left to stand in an explosion-proof oven (110° C.) for 12 hours. Next, the crosslinked body was filtered using a stainless steel mesh (30 meshes), and the stainless steel mesh was dried at 110° C. for eight hours. The residual amount B (g) on the stainless steel mesh was measured, and the gel fraction was computed using the following expression.

Gel fraction (% by mass)=100×B/A

Next, the crosslinking characteristic of the solar cell sealing material was evaluated using the following standards.

A: The gel fraction is equal to or more than 60% and equal to or less than 90%.
B: The gel fraction is equal to or more than 55% and less than 60% or the gel fraction is more than 90% and equal to or less than 100%.
C: The gel fraction is less than 55%.

Here, it is experimentally confirmed that, in a case where the gel fraction is less than 55%, the crosslinking characteristic of the solar cell sealing material is insufficient, and the heat resistance or adhesiveness of the crosslinked solar cell sealing material is poor.

The above-described evaluation results are shown in Table 1.

TABLE 1

|  | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|
| Ethylene·α-olefin copolymer | 100 | 100 | 100 | 100 | 100 | 100 | 100 | 100 | 100 | 100 |
| Organic peroxide (A-1) | 0.6 | 0.6 | 0.6 | 0.6 | 0.5 | 0.4 | 0.4 | 0.6 | 0.6 | 0.6 |
| Organic peroxide (B-1) | 0.05 | 0.1 | 0.2 | 0.6 | 0.2 | 0.3 | 0 | 0 | 0.02 | 0.7 |
| Silane coupling agent 1 | 0.3 | 0.3 | 0.3 | 0.3 | 0.3 | 0.3 | 0.3 | 0.3 | 0.3 | 0.3 |
| Crosslinking agent 1 | 0.8 | 0.8 | 0.8 | 0.8 | 0.8 | 0.8 | 0.8 | 0.8 | 0.8 | 0.8 |
| $X_2/X_1$ [—] | 0.08 | 0.17 | 0.33 | 1.00 | 0.40 | 0.75 | 0.00 | 0.00 | 0.03 | 1.17 |
| $X_1 + X_2$ [parts by mass] | 0.65 | 0.70 | 0.80 | 1.20 | 0.70 | 0.70 | 0.40 | 0.60 | 0.62 | 1.30 |
| Evaluation of formability | B | B | B | B | A | A | A | D | C | D |
| Evaluation of crosslinking characteristic | A | A | A | A | A | A | C | A | A | A |

The solar cell sealing materials of the examples in which the ratio ($X_2/X_1$) of the content $X_2$ of the organic peroxide (B) to the content $X_1$ of the organic peroxide (A) in the solar cell sealing material was equal to or more than 0.05 and equal to or less than 1.10 were respectively excellent in terms of the balance between formability and the crosslinking characteristic. On the other hand, the solar cell sealing materials of the comparative examples in which the ratio ($X_2/X_1$) of the content $X_2$ of the organic peroxide (B) to the content $X_1$ of the organic peroxide (A) in the solar cell sealing material was outside a range of equal to or more than 0.05 and equal to or less than 1.10 were respectively poor in terms of the balance between formability and the crosslinking characteristic.

Priority is claimed on Japanese Patent Application No. 2017-222823 filed on Nov. 20, 2017, the content of which is all incorporated herein by reference.

The invention claimed is:

1. A method of manufacturing a solar cell sealing material that is used to seal a solar cell element, comprising:
    a step of melting and kneading a resin composition containing an ethylene-α-olefin copolymer; an organic peroxide (A) having a one-hour half-life temperature in a range of equal to or higher than 100° C. and equal to or lower than 130° C.; and an organic peroxide (B) having a one-hour half-life temperature in a range of higher than 130° C. and equal to or lower than 160° C., and
    a step of forming the obtained solar cell sealing material into a sheet shape after the step of melting and kneading,
    wherein a ratio ($X_2/X_1$) of a content $X_2$ of the organic peroxide (B) to a content $X_1$ of the organic peroxide (A) in the solar cell sealing material is equal to or more than 0.08 and equal to or less than 1.0, and
    wherein the ethylene-α-olefin copolymer satisfies at least one of requirements a1) and a2) below,
    a1) a density measured on the basis of ASTM D1505 is 0.865 to 0.895 g/cm$^3$, and
    a2) a shore A hardness measured on the basis of ASTM D2240 is 60 to 95, and
    wherein the organic peroxide (A) includes 1,1-di(t-butylperoxy) cyclohexane, and the organic peroxide (B) includes 2,5-dimethyl-2,5-di(t-butylperoxy) hexane,
    wherein, when the resin composition is kneaded in a microrheology compound under conditions of 125° C. and a screw rotation speed of 30 rpm, a time taken for the torque to increase by 0.1 Nm from the minimum value is measured, and the time is regarded as a scorch time, the scorch time is equal to or longer than 14 minutes, and
    wherein the solar cell sealing material further includes a silane coupling agent and a crosslinking aid.

2. The method of manufacturing a solar cell sealing material according to claim 1,
    wherein MFR of the ethylene·α-olefin copolymer, which is on the basis of ASTM D1238 and measured under conditions of 190° C. and a load of 2.16 kg, is equal to or more than 1.0 g/10 minutes and less than 7.0 g/10 minutes.

3. The method of manufacturing a solar cell sealing material according to claim 1,
    wherein a total amount of the content $X_1$ of the organic peroxide (A) and the content $X_2$ of the organic peroxide (B) in the solar cell sealing material is equal to or more than 0.1 parts by mass and equal to or less than 3.0 parts by mass with respect to 100 parts by mass of the ethylene·α-olefin copolymer.

4. The method of manufacturing a solar cell sealing material according to claim 1,
    wherein a gel fraction of the solar cell sealing material is equal to or more than 55% and equal to or less than 100%.

5. The method of manufacturing a solar cell sealing material according to claim 1,
    wherein a content of the silane coupling agent in the solar cell sealing material is equal to or more than 0.1 parts by mass and equal to or less than 5.0 parts by mass with respect to 100 parts by mass of the ethylene-α-olefin copolymer.

6. The method of manufacturing a solar cell sealing material according to claim 1,
    wherein a content of the crosslinking aid in the solar cell sealing material is equal to or more than 0.1 parts by mass and equal to or less than 3.0 parts by mass with respect to 100 parts by mass of the ethylene-α-olefin copolymer.

7. The method of manufacturing a solar cell sealing material according to claim 1,
    wherein a ratio ($X_2/X_1$) of a content $X_2$ of the organic peroxide (B) to a content $X_1$ of the organic peroxide (A) in the solar cell sealing material is equal to or more than 0.08 and equal to or less than 0.17.

8. The method of manufacturing a solar cell sealing material according to claim 1,
    wherein a total amount of the content $X_1$ of the organic peroxide (A) and the content $X_2$ of the organic peroxide (B) in the solar cell sealing material is equal to or more than 0.5 parts by mass and less than 1.3 parts by mass with respect to 100 parts by mass of the ethylene·α-olefin copolymer.

9. The method of manufacturing a solar cell sealing material according to claim 1,
    wherein a ratio ($X_2/X_1$) of a content $X_2$ of the organic peroxide (B) to a content $X_1$ of the organic peroxide (A) in the solar cell sealing material is equal to or more than 0.08 and equal to or less than 0.17,
    wherein MFR of the ethylene·α-olefin copolymer, which is on the basis of ASTM D1238 and measured under conditions of 190° C. and a load of 2.16 kg, is equal to or more than 1.0 g/10 minutes and less than 7.0 g/10 minutes, and
    wherein a total amount of the content $X_1$ of the organic peroxide (A) and the content $X_2$ of the organic peroxide (B) in the solar cell sealing material is equal to or more than 0.5 parts by mass and less than 1.3 parts by mass with respect to 100 parts by mass of the ethylene·α-olefin copolymer.

10. The method of manufacturing a solar cell sealing material according to claim 1,
    wherein a ratio ($X_2/X_1$) of a content $X_2$ of the organic peroxide (B) to a content $X_1$ of the organic peroxide (A) in the solar cell sealing material is equal to or more than 0.08 and equal to or less than 0.17,
    wherein MFR of the ethylene·α-olefin copolymer, which is on the basis of ASTM D1238 and measured under conditions of 190° C. and a load of 2.16 kg, is equal to or more than 1.0 g/10 minutes and less than 7.0 g/10 minutes, and
    wherein a total amount of the content $X_1$ of the organic peroxide (A) and the content $X_2$ of the organic peroxide (B) in the solar cell sealing material is equal to or more than 0.5 parts by mass and equal to or less than 1.2 parts by mass with respect to 100 parts by mass of the ethylene·α-olefin copolymer.

* * * * *